United States Patent
Sasahara et al.

(10) Patent No.: US 8,282,984 B2
(45) Date of Patent: Oct. 9, 2012

(54) PROCESSING CONDITION INSPECTION AND OPTIMIZATION METHOD OF DAMAGE RECOVERY PROCESS, DAMAGE RECOVERING SYSTEM AND STORAGE MEDIUM

(75) Inventors: Reiko Sasahara, Nirasaki (JP); Jun Tamura, Nirasaki (JP); Shigeru Tahara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 908 days.

(21) Appl. No.: 12/326,507

(22) Filed: Dec. 2, 2008

(65) Prior Publication Data

US 2009/0146145 A1 Jun. 11, 2009

Related U.S. Application Data

(60) Provisional application No. 61/082,054, filed on Jul. 18, 2008, provisional application No. 61/034,510, filed on Mar. 7, 2008.

(30) Foreign Application Priority Data

Dec. 3, 2007 (JP) .................................. 2007-312562
Jun. 5, 2008 (JP) .................................. 2008-147701

(51) Int. Cl.
*C23C 14/54* (2006.01)

(52) U.S. Cl. ................................. 427/9; 427/8; 427/10
(58) Field of Classification Search ................ 427/8–10
See application file for complete search history.

(56) References Cited

U.S. PATENT DOCUMENTS

| 6,074,804 | A  | * | 6/2000 | Endo et al. ..................... 430/322 |
| 6,713,120 | B2 | * | 3/2004 | Fukuda et al. ..................... 427/9 |
| 2008/0057728 | A1 | * | 3/2008 | Shimura et al. ............... 438/735 |

FOREIGN PATENT DOCUMENTS

| JP | 2006-49798 | | 2/2006 |
| WO | WO 2006/003948 | * | 1/2006 |

* cited by examiner

*Primary Examiner* — Timothy Meeks
*Assistant Examiner* — Elizabeth Burkhart
(74) *Attorney, Agent, or Firm* — Oblon, Spivak, McClelland, Maier & Neustadt, L.L.P.

(57) ABSTRACT

A processing condition inspection method of a damage recovery process for reforming a film having OH groups generated by damages from a predetermined process by using a processing gas includes preparing a substrate having an OH group containing resin film, measuring an initial film thickness of the OH group containing resin film, performing a damage recovery process on the substrate after measuring the initial film thickness, measuring a film thickness of the OH group containing resin film after the damage recovery process, calculating a film thickness difference of the OH group containing resin film before and after the damage recovery process, and determining whether processing conditions of the damage recovery process are appropriate or inappropriate based on the film thickness difference.

22 Claims, 11 Drawing Sheets

PROCESSING CONDITION INSPECTION AND OPTIMIZATION METHOD OF DAMAGE RECOVERY PROCESS, DAMAGE RECOVERING SYSTEM AND STORAGE MEDIUM

FIELD OF THE INVENTION

The present invention relates to a processing condition inspection method and a processing condition optimization method of a damage recovery process for a film, e.g., a low dielectric film serving as an interlayer insulating film formed by a damascene method in a semiconductor device, having OH groups generated by etching damages or ashing damages, a damage recovering system and a storage medium.

BACKGROUND OF THE INVENTION

In a semiconductor device manufacturing process, a dual damascene method is widely used to form a wiring groove or a contact hole (see, e.g., Patent Document 1).

Meanwhile, as semiconductor devices are miniaturized, a parasitic capacitance of an interlayer insulating film has become an important factor to improve wiring performance. The interlayer insulating film employs a low dielectric constant film (low-k film) made of a low-k material. Further, the low-k film is generally made of a material having end groups of alkyl groups such as methyl groups.

However, in the aforementioned conventional damascene process, the low-k film is damaged during an etching process or a resist film removing process (ashing process). This damage increases the dielectric constant of the low-k film, and decreases effects obtained by using the low-k film as the interlayer insulating film.

As a technique for recovering such damage, Patent Document 2 discloses a method for performing a silylation process after etching or removal of the resist film. The silylation process is performed to reform a damaged surface portion having end groups of OH groups by using a silylation agent such that the OH end groups can be replaced by alkyl groups such as methyl groups.

In order to apply the damage recovery process to a mass production system, it is required to check whether the apparatus is normal or not by inspecting processing conditions in a chamber set-up of the silylation processing apparatus or a daily check. Currently, in order to inspect the processing conditions, etching and ashing processes are performed on a wafer having a low-k film and a silylation process is performed thereon to prepare a sample. Then, a dilute hydrofluoric acid treatment is performed on the sample, wherein CDs or film thicknesses t are measured before and after the dilute hydrofluoric acid treatment to obtain $\Delta CD$ or $\Delta t$, thereby inspecting the processing conditions.

However, when the processing conditions are inspected by the above-described technique, the sample needs to be prepared by performing etching and ashing before the silylation process. Therefore, the sample preparation time is required and, also, the processing conditions related only to the silylation processing apparatus cannot be inspected. In other words, even if $\Delta CD$ or $\Delta t$ is abnormal, it is not possible to determine whether the problem is related to the silylation process or to etching/ashing process.

Further, even if silylation conditions such as a gas concentration vary, $\Delta CD$ or $\Delta t$ obtained after the dilute hydrofluoric acid treatment is hardly changed. Furthermore, even if the same $\Delta CD$ or $\Delta t$ is obtained after the dilute hydrofluoric acid treatment on different samples, these samples often reveal different electrical characteristics. Namely, the processing conditions of the silylation process can not verified reliably.

[Patent Document 1] Japanese Patent Laid-open Publication No. 2002-083869

[Patent Document 2] Japanese Patent Laid-open Publication No. 2006-049798

SUMMARY OF THE INVENTION

In view of the above, the present invention provides a processing condition inspection method and a processing condition optimization method of a damage recovery process, capable of inspecting processing conditions only by a damage recovery process and precisely detecting abnormality of the processing conditions, and a processing condition optimization method.

Further, the present invention provides a damage recovering system capable of executing the above methods and a storage medium storing a program for implementing the above methods.

In accordance with a first aspect of the present invention, there is provided a processing condition inspection method of a damage recovery process for reforming a film having OH groups generated by damages from a predetermined process by using a processing gas, comprising: preparing a substrate having an OH group containing resin film; measuring an initial film thickness of the OH group containing resin film; performing a damage recovery process on the substrate after measuring the initial film thickness; measuring a film thickness of the OH group containing resin film after the damage recovery process; calculating a film thickness difference of the OH group containing resin film before and after the damage recovery process; and determining whether processing conditions of the damage recovery process are appropriate or inappropriate based on the film thickness difference.

In accordance with a second aspect of the present invention, there is provided a processing condition optimization method of a damage recovery process for reforming a film having OH groups generated by damages from a predetermined process by using a processing gas, comprising: preparing a substrate having an OH group containing resin film; measuring an initial film thickness of the OH group containing resin film; performing a damage recovery process on the substrate after measuring the initial film thickness; measuring a film thickness of the OH group containing resin film after the damage recovery process; calculating a film thickness difference of the OH group containing resin film before and after the damage recovery process; and adjusting processing conditions such that the film thickness difference of the OH group containing resin film before and after the damage recovery process has a value corresponding to optimal processing conditions based on previously obtained data for a relationship between the processing conditions and the film thickness difference.

In the first and second aspects, the film having the OH groups generated by the damages may be a low-k interlayer insulating film. Further, the OH group containing resin film may be an OH group containing photoresist film. In this case, preferably, the OH group containing photoresist film is a KrF resist film. Further, the film thickness of the OH group containing resin film after the damage recovery process may be larger than the initial film thickness due to reaction of the processing gas. Further, the damage recovery process may be performed by a silylation process using a silylation agent as a processing gas. Further, the predetermined process causing the damages may be etching and/or ashing.

In the second aspect, when the damage recovery process is performed by a silylation process using a silylation agent as a processing gas, preferably, the silylation process is performed at a temperature of 120 to 350° C. Further, preferably, the silylation process is performed at a processing gas pressure of 1 to 50 Torr (133 to 6666 Pa).

In accordance with a third aspect of the present invention, there is provided a damage recovering system comprising: a damage recovering apparatus for reforming a film having OH groups generated by damages from a predetermined process by using a processing gas; a film thickness measurement device for measuring a film thickness of a predetermined film; and a control unit for controlling operations of the system, the operations including loading a substrate having an OH group containing resin film into the film thickness measurement device, measuring an initial film thickness of the OH group containing resin film, performing a damage recovery process on the substrate in the damage recovering apparatus after measuring the initial film thickness, measuring a film thickness of the OH group containing resin film in the film thickness measurement device after the damage recovery process, calculating a film thickness difference of the OH group containing resin film before and after the damage recovery process, and determining whether processing conditions of the damage recovery process are appropriate or inappropriate based on the film thickness difference.

In accordance with a fourth aspect of the present invention, there is provided a damage recovering system comprising: a damage recovering apparatus for reforming a film having OH groups generated by damages from a predetermined process by using a processing gas; a film thickness measurement device for measuring a film thickness of a predetermined film; and a control unit for controlling operations of the system, the operations including loading a substrate having an OH group containing resin film into the film thickness measurement device, measuring an initial film thickness of the OH group containing resin film, performing a damage recovery process on the substrate in the damage recovering apparatus after measuring the initial film thickness, measuring a film thickness of the OH group containing resin film in the film thickness measurement device after the damage recovery process, calculating a film thickness difference of the OH group containing resin film before and after the damage recovery process, and adjusting processing conditions such that the film thickness difference of the OH group containing resin film before and after the damage recovery process has a value corresponding to optimal processing conditions based on previously obtained data for a relationship between the processing conditions and the film thickness difference.

In accordance with a fifth aspect of the present invention, there is provided a computer-readable storage medium storing a program for controlling a damage recovering system including a damage recovering apparatus for reforming a film having OH groups generated by damages from a predetermined process by using a processing gas and a film thickness measurement device for measuring a film thickness of a predetermined film, wherein the program, when executed, controls the damage recovering system to perform a processing condition inspection method of a damage recovery process, the method including: preparing a substrate having an OH group containing resin film; measuring an initial film thickness of the OH group containing resin film; performing a damage recovery process on the substrate after measuring the initial film thickness; measuring a film thickness of the OH group containing resin film after the damage recovery process; calculating a film thickness difference of the OH group containing resin film before and after the damage recovery process; and determining whether processing conditions of the damage recovery process are appropriate or inappropriate based on the film thickness difference.

In accordance with a sixth aspect of the present invention, there is provided a computer-readable storage medium storing a program for controlling a damage recovering system including a damage recovering apparatus for reforming a film having OH groups generated by damages from a predetermined process by using a processing gas and a film thickness measurement device for measuring a film thickness of a predetermined film, wherein the program, when executed, controls the damage recovering system to perform a processing condition inspection method of a damage recovery process, the method including: preparing a substrate having an OH group containing resin film; measuring an initial film thickness of the OH group containing resin film; performing a damage recovery process on the substrate after measuring the initial film thickness; measuring a film thickness of the OH group containing resin film after the damage recovery process; calculating a film thickness difference of the OH group containing resin film before and after the damage recovery process; and adjusting processing conditions such that the film thickness difference of the OH group containing resin film before and after the damage recovery process has a value corresponding to optimal processing conditions based on previously obtained data for a relationship between the processing conditions and the film thickness difference.

The present inventors carried out repeated examination based on the fact that the damages inflicted on the low-k film by etching or ashing cause generation of OH groups, and a damage recovery process, for example, a silylation process, is performed to reform a portion having the OH groups. As a result, they have found that the processing conditions can be inspected simply and precisely by performing the damage recovery process on a substrate having an OH group containing resin film and calculating a film thickness difference of the OH group containing resin film before and after the damage recovery process before a damage recovery process is performed on an actual substrate.

Namely, since the damage recovery process is performed on the substrate having the OH group containing resin film, a damage causing process such as etching, ashing and the like is not required before the damage recovery process. Accordingly, the sample preparation process becomes simple and, also, the processing conditions can be inspected only by the damage recovery process. Moreover, the film thickness of the OH group containing resin film changes with high sensitivity in response to a change in the processing conditions. Therefore, the processing conditions can be inspected simply and precisely.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

Figure 1:
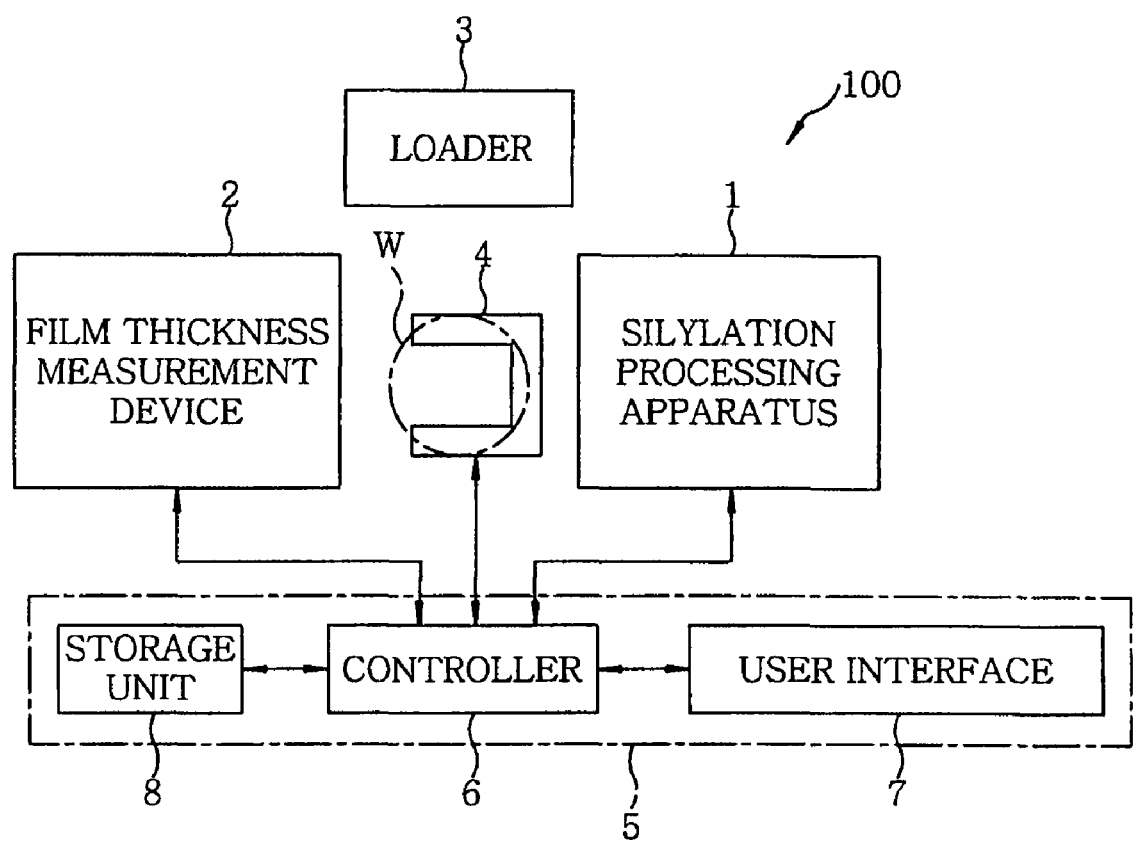
FIG. 1 is a block diagram showing a silylation processing system capable of performing a method of the present invention.

FIG. 1 is a block diagram showing a silylation processing system capable of performing a method of the present invention.

A silylation processing system 100 performs a silylation process as a damage recovery process on a low-k film formed as an interlayer insulating layer on a semiconductor wafer W serving as a substrate to be processed. Further, the silylation processing system 100 includes a silylation processing apparatus 1 for performing a silylation process, a film thickness measurement device 2 for measuring a thickness of a photoresist film formed on a test wafer used to inspect processing conditions of the present embodiment, a loader 3 for mounting thereon a carrier accommodating therein a plurality of wafers W, a transfer device 4 for transferring the wafer W, and a control unit 5 for controlling each of the above components.

The control unit 5 has a controller 6 having a micro processor (computer) which is connected to and controls each of the silylation processing apparatus 1, the film thickness measurement device 2, the loader 3 and the transfer device 4. The controller 6 is connected to a user interface 7 including a keyboard for inputting commands, a display for displaying an operational status of the silylation processing system 100 and the like such that an operator can manage the silylation processing system 100.

The controller 6 is also connected to a storage unit 8 which stores control programs for controlling the respective components of the silylation processing system 100, or programs (i.e., recipes) for performing predetermined processes in the silylation processing system 100. The recipes are stored in a storage medium of the storage unit 8. The storage medium may be a fixed storage medium such as a hard disk, or a portable storage medium such as a CD-ROM, a DVD and a flash memory. Further, the recipes can be transmitted from another device via, e.g., a dedicated line. If necessary, a certain recipe may be retrieved from the storage unit 92 in accordance with the commands inputted through the user interface 91 and executed in the controller 6 such that a desired process is performed under control of the controller 6.

Figure 2:
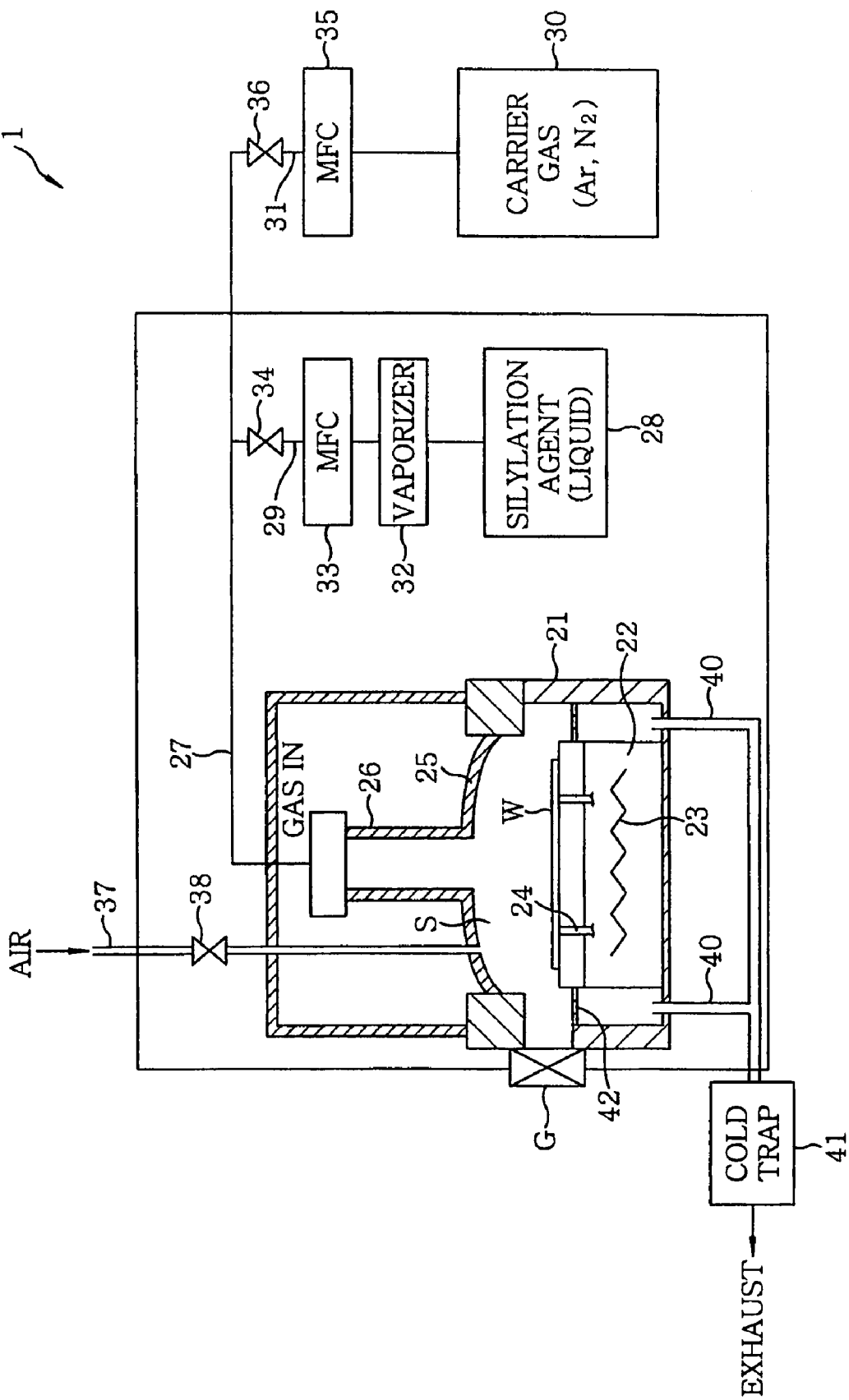
FIG. 2 describes a schematic cross sectional view of a silylation processing apparatus of the silylation processing system of FIG. 1.

The silylation processing apparatus 1 serving as the damage recovering apparatus may have a configuration shown in a schematic cross sectional view of FIG. 2. The silylation processing apparatus 1 has a chamber 21 accommodating therein the wafer W, and a wafer mounting table 22 is installed at a lower portion of the chamber 21. A heater 23 is buried in the wafer mounting table 22, so that the wafer W mounted on the wafer mounting table 22 can be heated to a desired temperature. The wafer mounting table 22 is provided with wafer lifting pins 24 which can be protruded from or retracted into the wafer mounting table 22. The wafer lifting pins 24 can place the wafer W at a predetermined position above and separated from the wafer mounting table 22, when the wafer W is transferred to and from the wafer mounting table 22.

The chamber 21 is provided with an inner vessel 25 which defines a narrow processing space S for accommodating the wafer W. A silylation agent (silylation gas) is supplied into this processing space S. The inner vessel 25 has a gas inlet path 26 formed at its center and extending in a vertical direction.

An upper portion of the gas inlet 26 is connected to a gas supply line 27. The gas supply line 27 is connected to a line 29 extending from a silylation agent supply source 28 for supplying a silylation agent such as TMSDMA (N-Trimethylsilyldimethylamine), DMSDMA (Dimethylsilyldimethylamine), TMDS (1,1,3,3-Tetramethyldisilazane), TMSPyrole (1-Trimethylsilylpyrole), BSTFA (N,O-Bis(trimethylsilyl)trifluoroacetamide) and BDMADMS (Bis(dimethylamino)dimethylsilane), and a line 31 extending from a carrier gas supply source 30 for supplying a carrier gas such as Ar or $N_2$ gas. The line 29 is provided with a vaporizer 32 for vaporizing the silylation agent, a mass flow controller 33 and an opening/closing valve 34 disposed thereon in this order from the silylation agent supply source 28.

The line 31 is provided with a mass flow controller 35 and an opening/closing valve 36 disposed thereon in this order from the carrier gas supply source 30. The silylation agent vaporized by the vaporizer 32 is carried by the carrier gas and is supplied through the gas supply line 27 and the gas inlet path 26 into the processing space S defined by the inner vessel 25. When the process is performed, the wafer W is heated by the heater 23 to a predetermined temperature. In this case, the wafer temperature can be controlled, for example, in a range from a room temperature to 300° C.

An air inlet line 37 is installed to extend from the atmosphere outside the chamber 21 to the inner vessel 25 inside the chamber 21. The air inlet line 37 is provided with a valve 38. As the valve 38 is opened, air is introduced into the processing space S defined by the inner vessel 25 inside the chamber 21. Accordingly, moisture supplied with the air facilitates a silylation reaction.

A gate valve G is provided at a sidewall of the chamber 21. While the gate valve G is opened, the wafer W is loaded into or unloaded from the chamber 1. A load-lock chamber (not shown) communicates with the chamber 21 via the gate valve G. The wafer is transferred to the load-lock chamber maintained at an atmospheric pressure by the transfer device 4 in the atmosphere. Then, the load-lock chamber is evacuated to vacuum, and the wafer W is loaded into the chamber 21 by a transfer unit (not shown) provided in the load-lock chamber. When the wafer W is unloaded, a reverse operation is performed.

Gas exhaust lines 40 are provided at a bottom peripheral portion of the chamber 21. Thus, the inside of the chamber 21 can be exhausted to a predetermined pressure by a vacuum pump (not shown) through the gas exhaust lines 40. A cold trap 41 is disposed on the gas exhaust lines 40. A baffle plate 42 is disposed between an upper portion of the wafer mounting table 22 and the chamber wall.

The film thickness measuring device 2 may employ a film thickness measuring device generally used in this field, for example, a device having a commercially available spectral reflectance thickness gauge in a housing.

A silylation process for an actual wafer is performed to recover damages of a low-k film by a silylation reaction using a silylation agent (silylation gas), the damages being caused by performing etching and ashing on a wafer having the low-k film as an interlayer insulating film. To be specific, the low-k film is reformed by replacing OH groups generated in the low-k film due to the damages with silyl groups such as trimethyl silyl groups, thus recovering the electrical characteristics and the like.

In the present embodiment, the processing conditions of the silylation processing apparatus are inspected before an actual wafer is processed. The detailed description thereof will be given hereinafter.

The processing conditions of the silylation processing apparatus need to be inspected by actually performing the silylation process. However, as described above, the silylation process serving as a damage recovery process is carried out by replacing the OH groups generated by etching damages or ashing damages with the silyl groups. The low-k film does not have OH groups in an initial state, and the silylation reaction does not take place. For that reason, in a conventional case, etching and ashing processes are performed on a wafer having a low-k film to prepare a sample having OH groups. Then, a silylation process is performed on the sample and, then, a dilute hydrofluoric acid treatment is performed thereon. Accordingly, a film thickness variation or a CD variation of the low-k film is detected, thereby inspecting the processing conditions.

However, when the processing conditions are inspected as described above, a sample preparation process becomes complicated and, also, the processing conditions of the silylation process cannot be obtained independently. In addition, sensitivity is not sufficient.

Thus, in the present embodiment, a silylation process is performed on a wafer having a photoresist film containing OH groups and, then, a film thickness difference of the film is detected. As a consequence, the processing conditions can be inspected simply and precisely.

Figure 3:
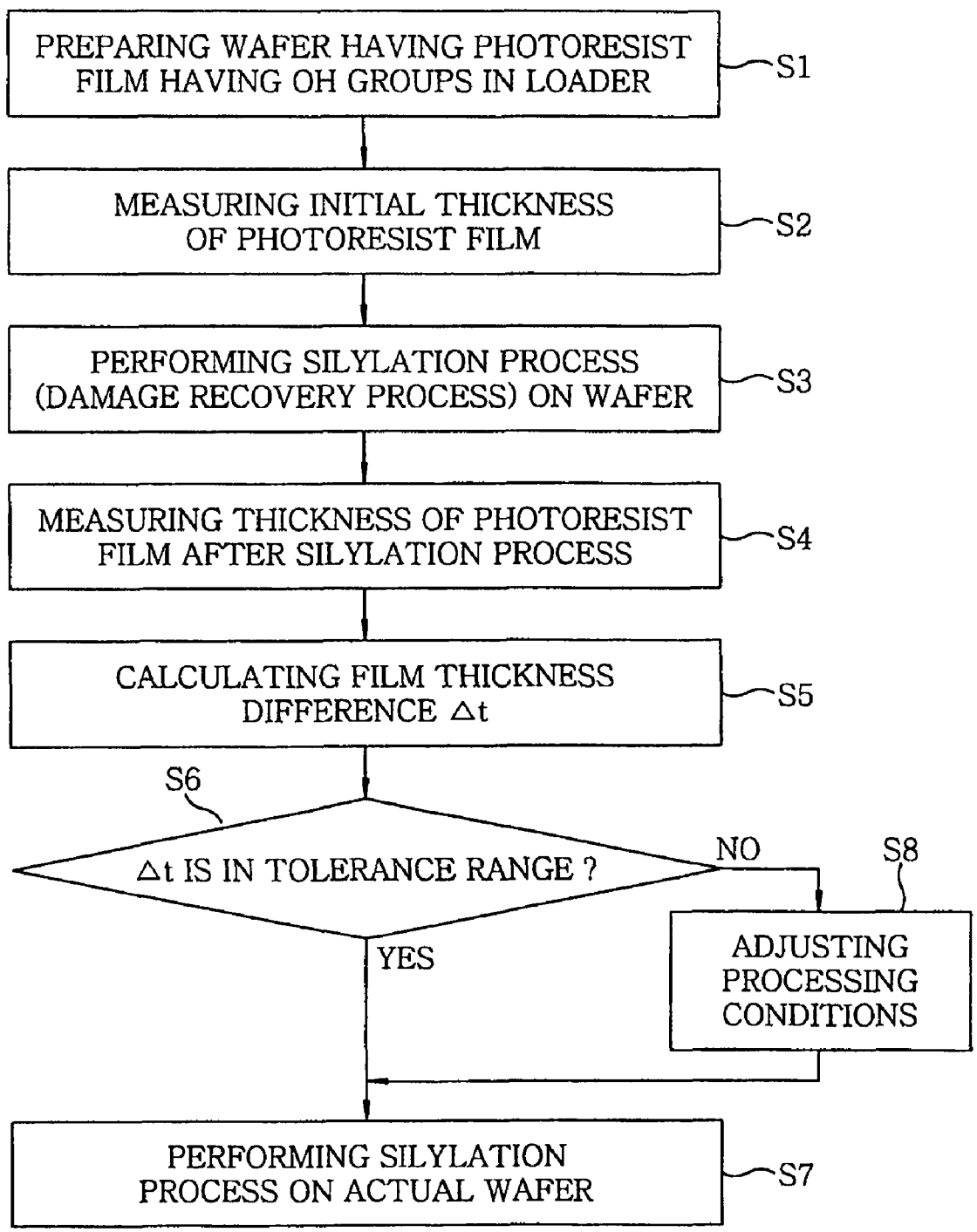
FIG. 3 provides a flow chart showing a processing condition inspection method of the silylation processing apparatus using the silylation processing system of FIG. 1.

FIG. 3 is a flow chart showing a processing condition inspection method of the silylation processing apparatus using the silylation processing system.

First of all, a carrier accommodating therein a test wafer having a photoresist film containing OH groups is loaded on the loader 3 (step S1). The photoresist film containing OH groups may employ a G-line resist film or a KrF resist film.

Next, the test wafer is unloaded from the carrier on the loader 3 by the transfer device 4, and then is transferred to the film thickness measurement device 2. A film thickness of the photoresist film containing the OH groups is measured by the film thickness measurement device 2 (step S2).

Thereafter, the test wafer is transferred to the silylation processing apparatus 1 by the transfer device 4, and a silylation process serving as a damage recovery process is performed on the test wafer (step S3). When the test wafer is loaded into the silylation processing apparatus 1, first, the test wafer is transferred to the load-lock chamber (not shown) and the pressure is adjusted therein. Then, the test wafer is loaded into the chamber 21 by the transfer unit (not shown) in the load-lock chamber.

At this time, the conditions of the silylation process, e.g., processing time, a pressure, concentration of silylation gas, a temperature and the like, are set based on a predetermined recipe for processing an actual wafer. For example, when a G-line resist film is used as a photoresist film and TMSDMA is used as a silylation agent (silylation gas), the reaction between the photoresist film and the silylation agent takes place as will be described later, and the film thickness of the photoresist film increases.

[Chemical Formula 1]

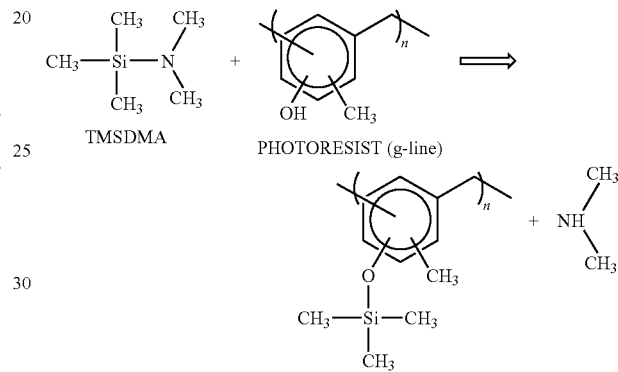

After the silylation process is carried out, the test wafer is returned from the chamber 1 to the load-lock chamber. Then, the load-lock chamber is open to the atmosphere and the test wafer is transferred to the film thickness measurement device 2 by the transfer device 4. Accordingly, the film thickness of the photoresist film containing OH groups after the silylation process is measured (step S4).

Thereafter, an operation unit of the controller 6 calculates a film thickness difference (film thickness increase amount after the silylation process) $\Delta t$ between an initial film thickness of the photoresist film, which was measured in step S2, and a film thickness of the photoresist film after the silylation process, which was measured in step S4 (step S5).

Next, it is determined whether the film thickness difference $\Delta t$ is within a tolerance range (step S6). Accordingly, it is possible to determine whether the processing conditions of the silylation processing apparatus 1 are appropriate or not.

If the film thickness difference $\Delta t$ is within the tolerance range, the silylation process for an actual wafer is initiated (step S7). On the contrary, if $\Delta t$ is not within the tolerance range, the processing conditions are adjusted (step S8) and, then, the silylation process is initiated.

The above-described inspection process can be controlled by the control unit 5 as will be described hereinafter. After the carrier accommodating therein the test wafer is loaded on the loader 3 in step S1, the test wafer is transferred to the film thickness measurement device 2 by controlling the transfer device 4. Next, the film thickness of the photoresist film measured in step S2 is transmitted to the controller 6. After the silylation process is completed, the test wafer is transferred to the film thickness measurement device 2 by controlling the transfer device 4.

Then, the film thickness of the photoresist film after the silylation process, which was measured in step S4, is transmitted to the controller 6. The operation unit of the controller 6 calculates the film thickness difference Δt based on the above data in step S5. By comparing Δt and a film thickness difference corresponding to preset normal silylation processing conditions, it is determined in step S6 whether or not Δt is within a tolerance range. The result thereof is displayed on, e.g., the display of the user interface 7. When Δt is not within the tolerance range, an alarm indicating abnormality can be operated. When there is abnormality, the processing conditions can be also adjusted by the instruction from the controller 6.

The film thickness of the photoresist film containing OH groups, such as a G-line resist film or a KrF resist film, increases after the silylation reaction between the OH groups and the silylation agent (silylation gas). This is because the OH groups are replaced with silyl groups. In the low-k film, a film thickness increase amount after the silylation reaction is extremely small.

On the contrary, in the photoresist film containing OH groups, a film thickness variation is large and, also, a film thickness difference can be achieved precisely and reproducibly by varying the silylation processing conditions. Therefore, it is possible to determine whether the silylation processing conditions are appropriate or not by measuring the film thickness difference Δt. In other words, the progress of the silylation reaction changes depending on the silylation processing conditions, and it is precisely and reproducibly reflected on a film thickness difference before and after the silylation process of the photoresist film. If the film thickness difference Δt is within an appropriate range, it is determined that the silylation processing conditions are normal. Otherwise, it is determined that the silylation processing conditions are abnormal.

Hereinafter, results of actually measuring a film thickness variation when the silylation process was performed on the photoresist film containing OH groups will be explained.

Figure 4:
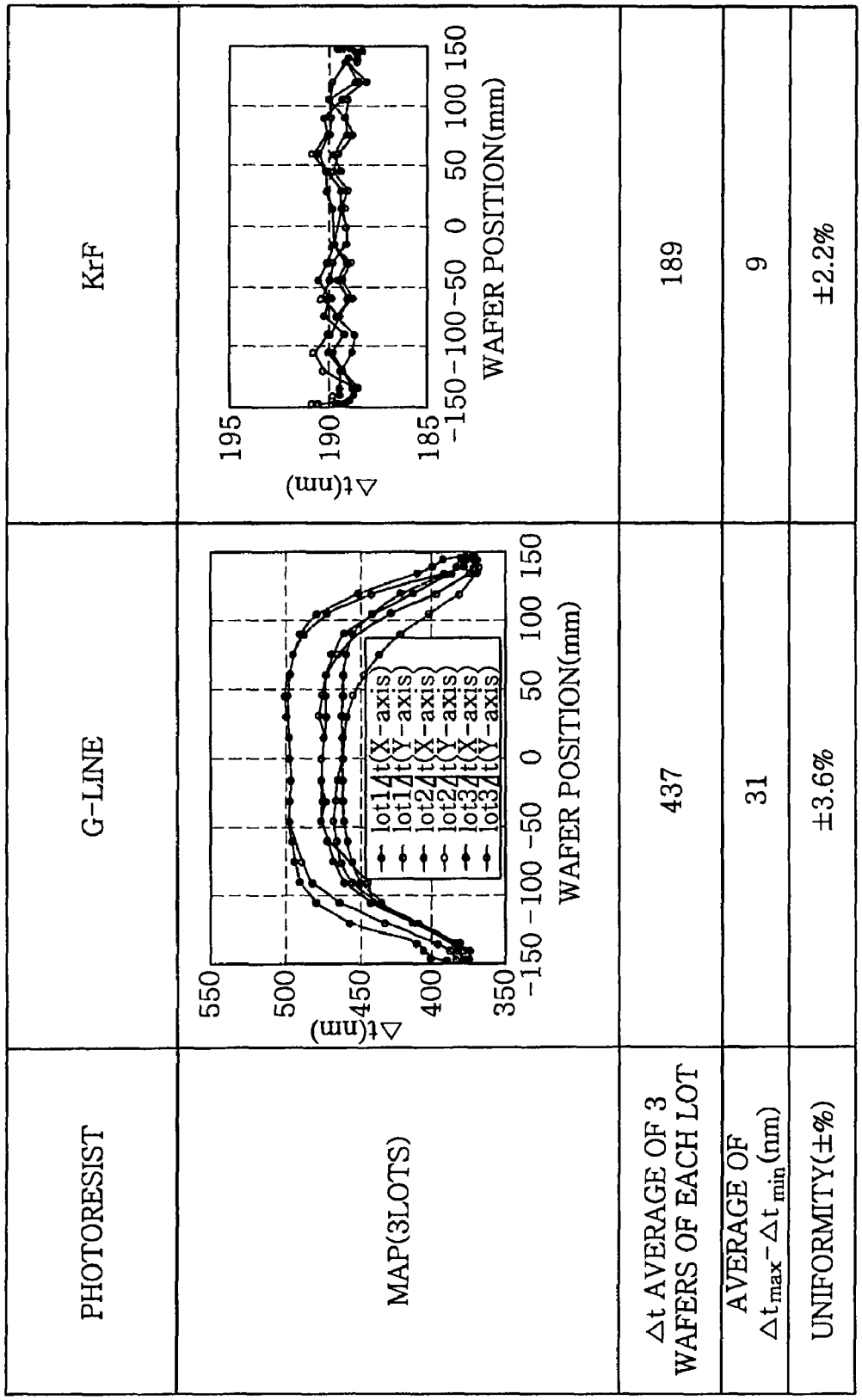
FIG. 4 illustrates results of measuring a film thickness increase amount (film thickness difference) when a silylation process is performed on a wafer having a G-line resist film and a KrF resist film as a photoresist film containing OH groups.

FIG. 4 shows results of measuring a film thickness increase amount (film thickness difference) Δt when a silylation process was performed on a wafer having a G-line resist film and a KrF resist film as a photoresist film containing OH groups. In this case, the silylation process was performed under following conditions: a pressure in the chamber at about 50 Torr (about 6666 Pa); TMSDMA serving as a silylation agent; a flow rate of about 500 sccm (mL/min); a stage temperature controlled at about 180° C.; and processing time of about 150 sec. Further, an optical interferometric film thickness measurement device (trade mark: NanoSpec 8300) was used as a film thickness measurement device (same device was also used in the following).

As illustrated in FIG. 4, the average of the film thickness increase amount Δt in the G-line resist film was about 437 nm, and that in the KrF resist film was about 189 nm. Namely, it was found that the film thickness increased in both films. Further, although the same silylation process was performed on wafers of different lots, the same results were obtained with reproducibility. Although the non-uniformity in both films was within about ±5%, the non-uniformity of the KrF resist film was smaller. From the above, it is considered that it is advantageous to use a KrF resist film. Further, Δt was calculated by considering shrinkage of the resist film due to the application of heat during the silylation process. Namely, Δt was obtained by adding a shrinkage value due to the heating to a difference value between an initial film thickness and a film thickness measured after the silylation. These are the same in the following cases.

Figure 5:
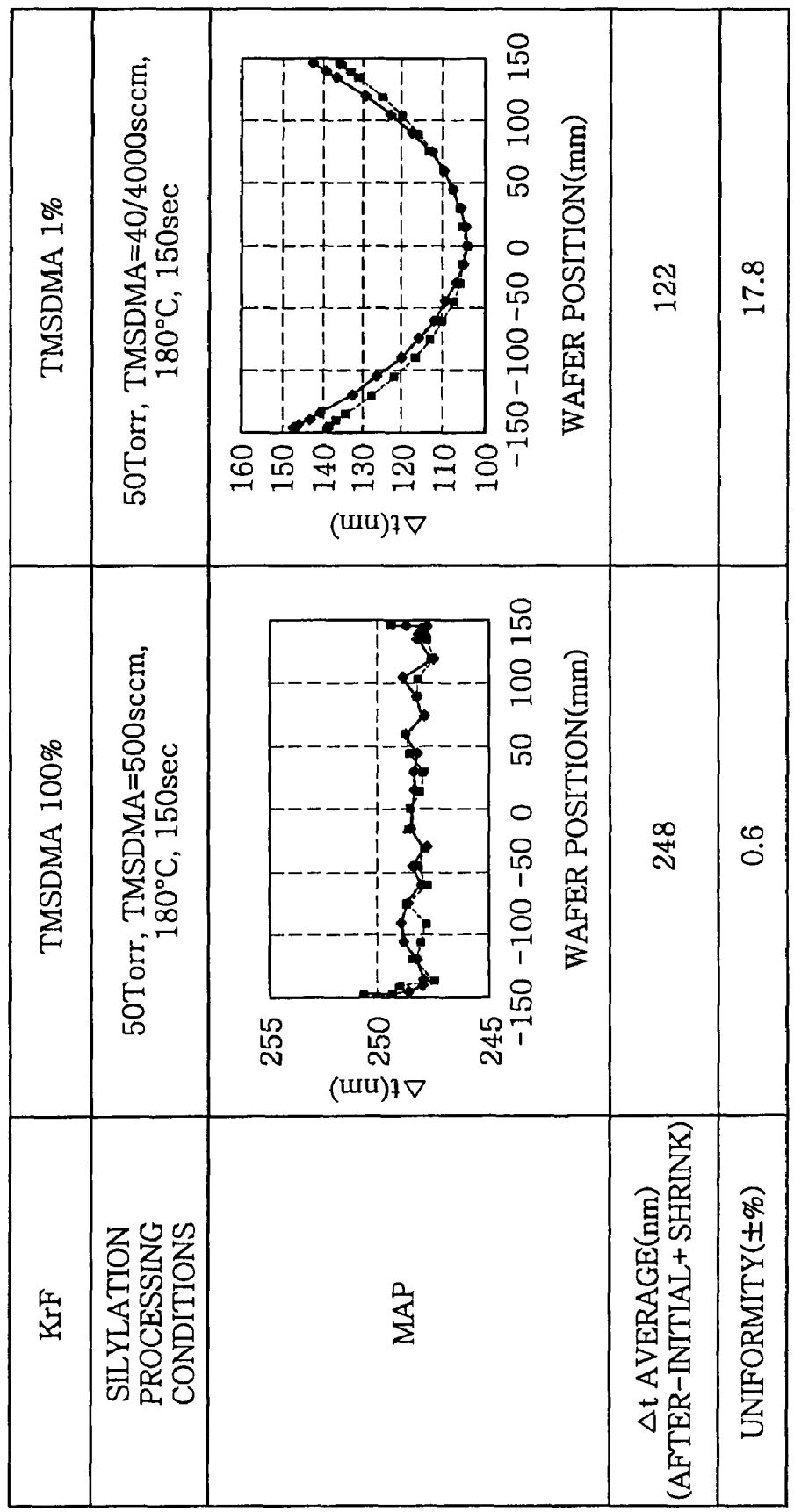
FIG. 5 offers results of measuring a film thickness increase amount (film thickness difference) when a silylation process is performed on a wafer having a KrF resist film as a photoresist film containing OH groups while varying concentration of a silylation agent.

Next, it was checked whether it was possible to detect changes in the concentration of the silylation agent. The results thereof are shown in FIG. 5. FIG. 5 depicts results of measuring a film thickness increase amount (film thickness difference) Δt when a silylation process was performed on a wafer having a KrF resist film as a photoresist film containing OH groups while varying concentration of a silylation agent. In this case, the silylation process was performed under following conditions: a pressure in the chamber at about 50 Torr (about 6666 Pa); a stage temperature controlled at about 180° C.; and processing time of about 150 sec. The silylation process was performed while TMSDMA having a flow rate of about 500 sccm (mL/min) (TMSDMA 100%) was independently supplied as a silylation agent. Further, the silylation process was performed while a mixture of TMSDMA and $N_2$ gas having respective flow rates of about 40 sccm (mL/min) and 4000 sccm (mL/min) (TMSDMA 1%) was supplied in a diluted state. As shown in FIG. 5, the average of Δt in TMSDMA 100% was about 248 nm, and the average of Δt in TMSDMA 1% was about 122 nm. It was checked that the film thickness increase amount (film thickness difference) Δt changed depending on a dilution ratio of TMSDMA. From the above, it was found that when the gas supply system of the silylation processing apparatus had a defect, the defect was detectable from the difference of the film thickness increase amount (film thickness difference) Δt.

Figure 6:
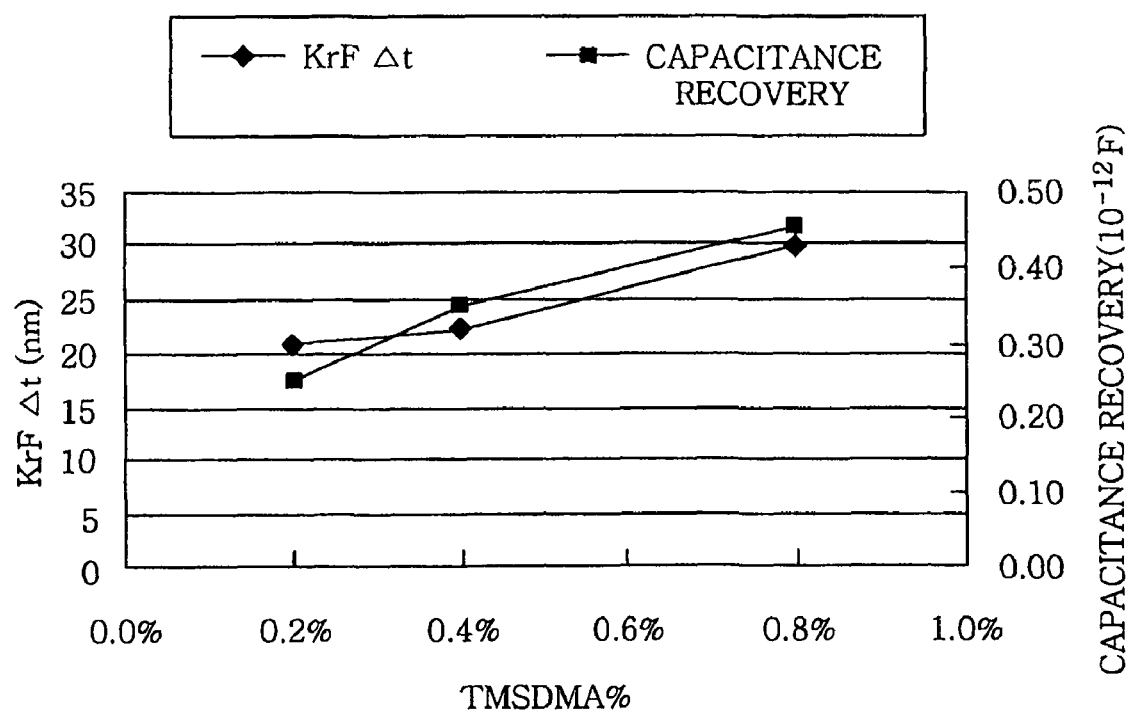
FIG. 6 presents a relationship between concentration (dilution ratio) of TMSDMA which is indicated in a horizontal axis and a film thickness increase amount (film thickness difference) Δt of a KrF resist film and a capacitance recovery amount of a low-k film which are indicated in vertical axes.

Next, while varying the dilution ratio of the silylation agent among the silylation processing conditions, an experiment was conducted to check the variation of the film thickness increase amount (film thickness difference) Δt of the KrF resist film and the variation of the capacitance recovery amount when a silylation process is performed on a low-k film. The results thereof are shown in FIG. 6. FIG. 6 illustrates a relationship between concentration (dilution ratio) of TMSDMA which is indicated in a horizontal axis and a film thickness increase amount (film thickness difference) Δt of the KrF resist film and a capacitance recovery amount of the low-k film which are indicated in vertical axes.

In this case, the silylation process was performed under following conditions: a pressure in the chamber at about 20 Torr (about 2666 Pa); a stage temperature controlled at about 180° C.; and processing time of about 30 sec. TMSDMA was used as a silylation agent, and the silylation process was performed while TMSDMA and $N_2$ gas are supplied at flow rates of 80/4000 sccm (mL/min), 40/4000 sccm (mL/min) and 20/4000 sccm (mL/min) (concentrations of TMSDMA of about 0.2%, 0.4% and 0.8%), respectively. As can be seen from FIG. 6, the tendency of the film thickness increase amount (film thickness difference) Δt of the KrF resist film is substantially the same as that of the capacitance recovery amount. Further, it was found that the capacitance recovery effect (damage recovery effect) obtained by the silylation process was checked from the film thickness increase amount (film thickness difference) Δt in the present embodiment. In other words, it was seen that as Δt increased, the damage recovery effect by the silylation process increased.

Figure 7A:
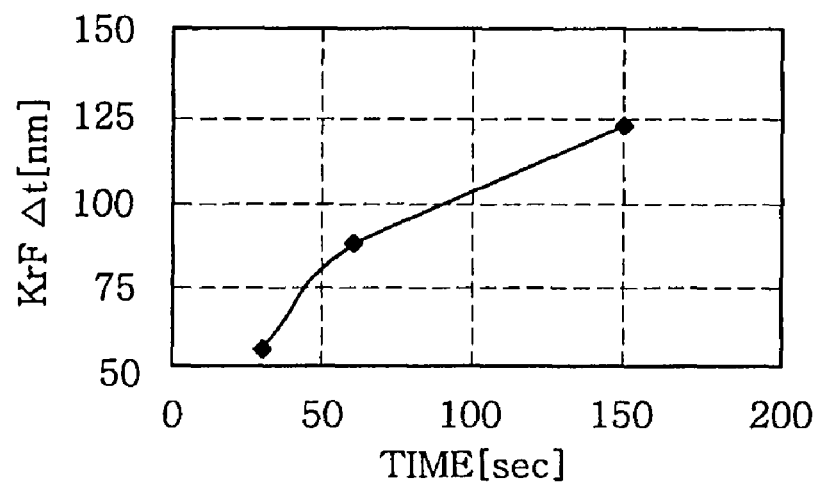
FIGS. 7A to 7D show a relationship between silylation processing time and Δt, a relationship between a pressure in a chamber and Δt, a relationship between concentration of a silylation agent (TMSDMA) and Δt, and a relationship between a temperature and Δt, respectively.
Figure 7B:
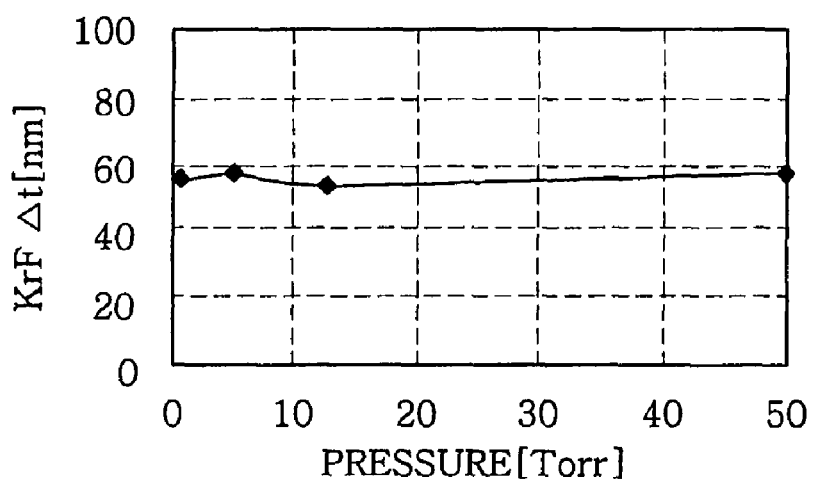
Figure 7C:
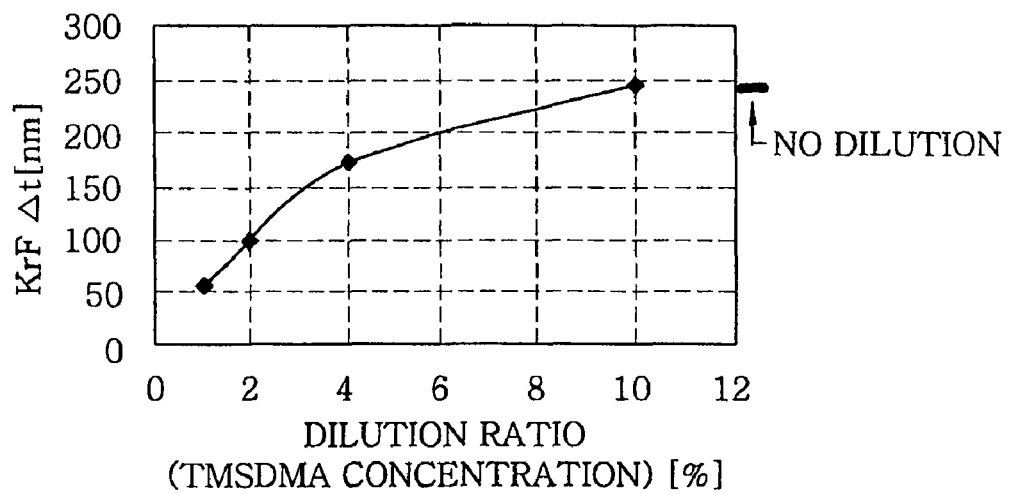
Figure 7D:
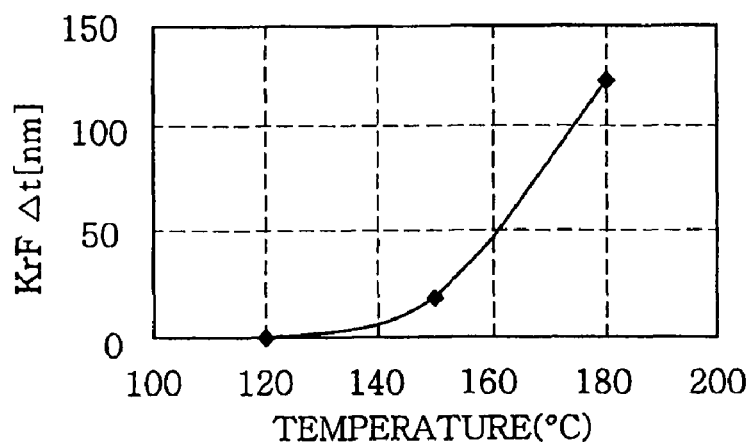

Next, the variation of the film thickness increase amount (film thickness difference) Δt of the KrF resist film was measured while varying various silylation processing conditions. The results thereof are illustrated in FIGS. 7A to 7D. FIG. 7A shows a relationship between silylation processing time and Δt; FIG. 7B depicts a relationship between a pressure in the chamber and Δt; FIG. 7C describes a relationship between concentration (dilution ratio) of a silylation agent (TMSDMA) and Δt; and FIG. 7D provides a relationship between a temperature and Δt.

As depicted in FIGS. 7A, 7C and 7D, Δt increases as the processing time, the concentration of a silylation agent and the temperature increase. Further, the damage recovery effect increases as the silylation processing time, the concentration of a silylation agent and the temperature increase. Furthermore, Δt is the same in both cases of the TMSDMA concentration of 10% and no dilution (TMSDMA 100%), so that the same damage recovery effect can be obtained in both cases of the dilution ratio of 10% or no dilution. Namely, even if the concentration of TMSDMA exceeds 10%, the effect is saturated. Therefore, it is preferable to use TMSDMA having a dilution ratio of 10% in view of the cost.

As shown in FIG. 7B, the value of Δt does not change even if the pressure in the chamber increases. Here, the pressure was adjusted by $N_2$ gas while maintaining the constant flow rate of TMSDMA, and the molecular weight of TMSDMA is set to be the same at each pressure level. From the above, it is expected that Δt increases by increasing the pressure and the molecular weight of the silylation agent.

Based on the above results, it is clear that the film thickness increase amount (film thickness difference) Δt of the photoresist film containing OH groups, which is measured after the silylation process, reflects the changes of the silylation processing conditions, and whether the silylation processing conditions are appropriate or not can be determined by measuring Δt. Moreover, the tendency of the variation of Δt in accordance with the changes of the silylation processing conditions is the same as that of the variation of the capacitance recovery amount of the low-k film. Thus, the processing conditions of the silylation process serving as a damage recovery process can be optimized by using a technique for calculating the film thickness increase amount (film thickness difference) Δt of the photoresist film having OH groups after the silylation process.

In order to optimize the processing conditions, Δt is obtained by performing a silylation process on a test wafer under initial conditions based on a relationship between Δt and various processing conditions which is stored in advance in the storage unit 8 of the control unit 5. Then, the silylation processing conditions are adjusted based on Δt so that the film thickness difference can have a value corresponding to the optimal silylation conditions.

However, in the conventional case, the silylation process was performed by using an excessive amount of liquid chemical without optimizing the silylation processing conditions by collectively considering throughput, device characteristics, and reactivity to temperatures, pressures and the like. Accordingly, it was difficult to achieve a maximum reaction amount with a minimum liquid chemical cost.

Based on the above fact, a process for optimizing the silylation processing conditions will be described hereinafter.

First of all, it was found that that the film thickness of the photoresist film containing OH groups increased when the silylation processing temperature was higher than or equal to about 120° C. Meanwhile, the heat resistant temperature of the semiconductor device is about 350° C. Therefore, it is preferable that the silylation processing temperature is between about 120° C. and about 350° C.

Next, the pressure in the chamber (gas pressure) in the silylation process will be explained. In this case, a KrF resist was used as a photoresist containing OH groups, and TMSDMA was used as a silylation agent (silylation gas). The temporal variation of the TMSDMA partial pressure and the relationship between the pressure and the film thickness variation Δt of the KrF resist film were obtained at varied pressures ($N_2$ pressure+TMSDMA pressure) in the chamber of about 1.5 Torr (200 Pa), 5 Torr (667 Pa), 12.5 Torr (1666 Pa) and 50 Torr (6666 Pa) under the following conditions: a TMSDMA partial pressure of about 0.75 Torr (100 Pa); a silylation processing temperature controlled at about 180° C.; and a total processing time of about 70 seconds. The results thereof are shown in FIGS. 8A and 8B.

Figure 8A:
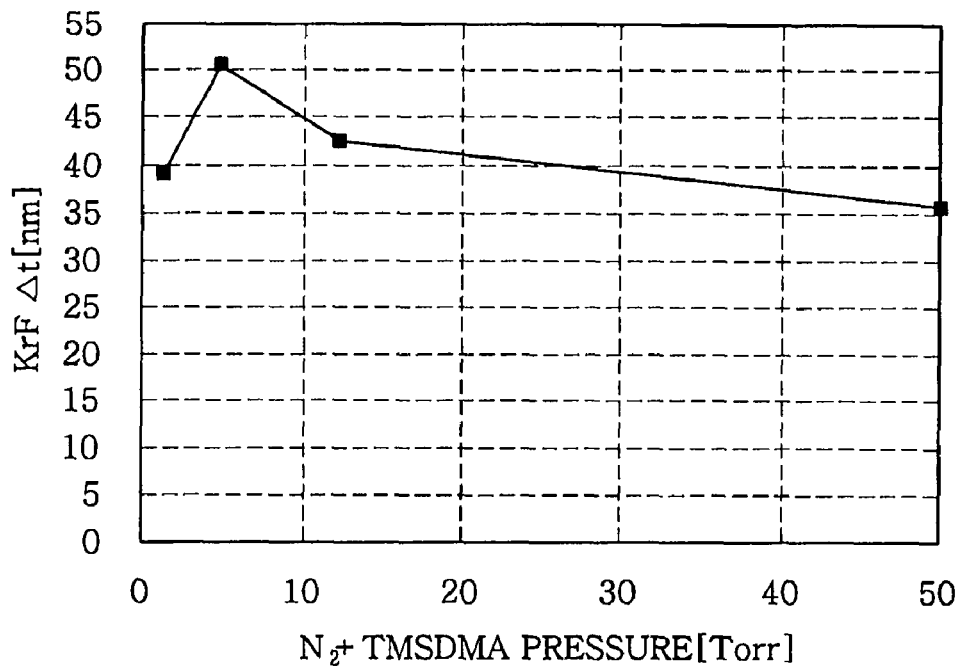
FIGS. 8A and 8B depict a relationship between a pressure in a chamber and Δt of a KrF resist film and a relationship between processing time and a TMSDMA partial pressure at each pressure level in a chamber, respectively.
Figure 8B:
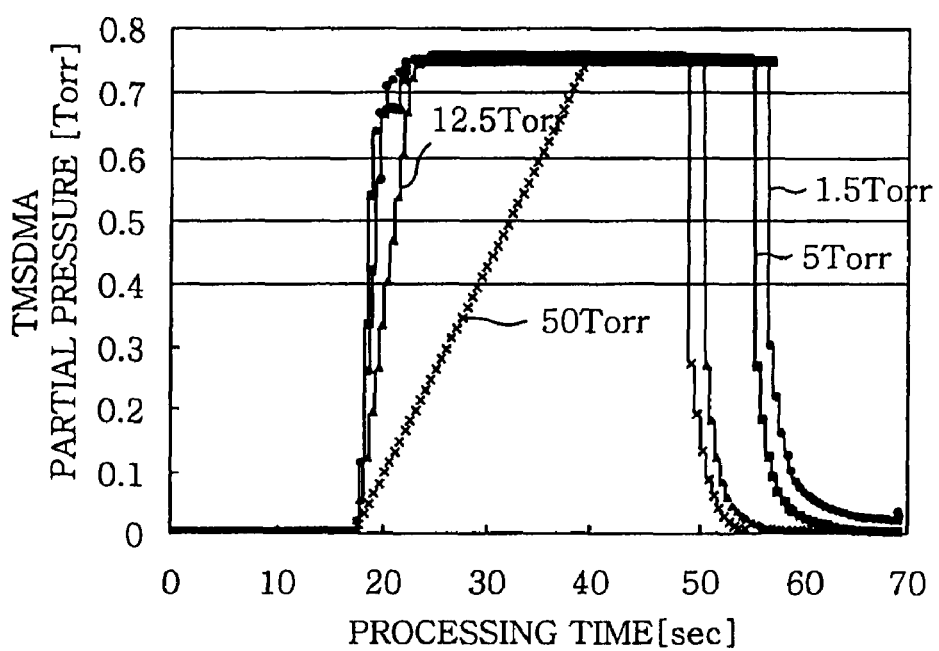

FIG. 8A shows a relationship between the pressure in the chamber and the film thickness variation of the KrF resist, and FIG. 8B illustrates a temporal variation of the TMSDMA partial pressure at each pressure level. As can be seen from FIGS. 8A and 8B, when the pressure in the chamber ranges from about 1.5 Torr to 12.5 Torr (about 200 Pa to 1666 Pa), it is possible to obtain relatively high Δt and relatively high reactivity. Specially, when the pressure in the chamber is about 5 Torr (667 Pa), it is possible to obtain the highest Δt and the highest reactivity. Meanwhile, when the pressure in the chamber is about 50 Torr (6666 Pa), a period of time, required for the pressure increase and the vacuum evacuation, becomes longer. Therefore, it reduces a period of time for which the silylation agent is maintained at a predetermined partial pressure, and a reaction amount tends to be small. As a consequence, it is preferable that the pressure in the chamber is equal to or smaller than about 50 Torr (6666 Pa).

Figure 9:
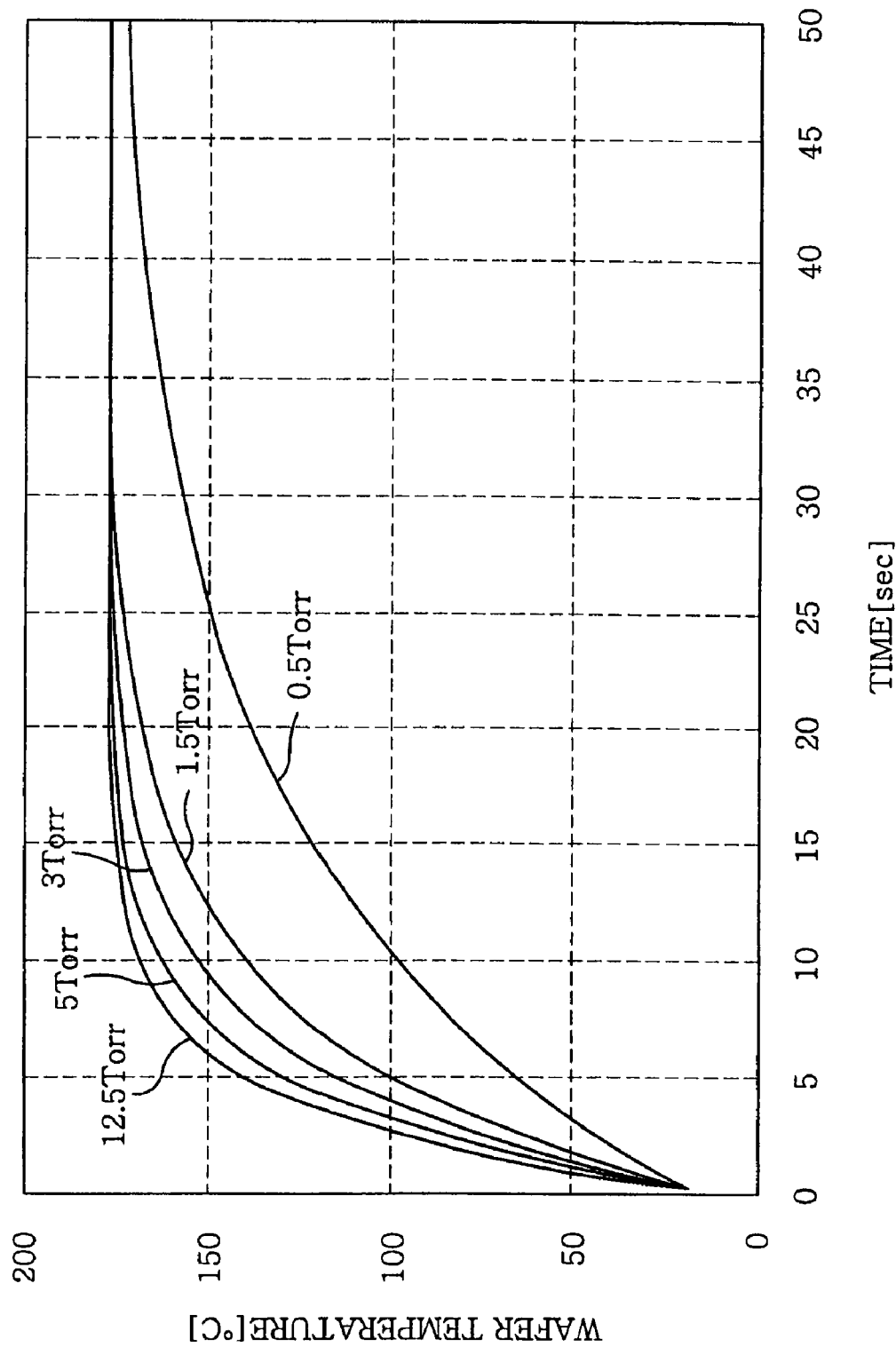
FIG. 9 illustrates a temperature increase curve of a wafer at each pressure level in a chamber.

Meanwhile, a period of time required to increase the temperature of the wafer to about 180° C. was measured at varied pressures in the chamber of about 0.5 Torr (66.7 Pa), 1.5 Torr (200 Pa), 3 Torr (400 Pa), 5 Torr (667 Pa) and 12.5 Torr (1666 Pa). The results thereof are shown in FIG. 9. As illustrated in FIG. 9, when the pressure in the chamber is about 0.5 Torr (66.7 Pa), the heat conductivity is low and, hence, the temperature increasing time becomes longer. On the contrary, when the pressure in the chamber is larger than or equal to about 1.5 Torr (200 Pa), it is possible to reduce the temperature increasing time. Also when the pressure in the chamber is smaller than or equal to about 1.5 Torr, it is considered that the temperature increasing time can be reduced. From the above, it is clear that the pressure in the chamber is preferably larger than or equal to about 1 Torr (133 Pa), and more preferably larger than or equal to about 1.5 Torr (200 Pa).

Next, a description is given of a substrate processing system which has therein a silylation processing system for implementing the present invention and can perform etching, ashing and silylation processes successively.

The silylation process serving as a damage recovery process is performed after an etching process and an ashing process are completed. Therefore, it is preferable to perform the silylation process successively after the etching process and the ashing process without breaking a vacuum. Here, there will be described a multi chamber type substrate processing system capable of performing etching, ashing and silylation processes successively without breaking a vacuum.

Figure 10:
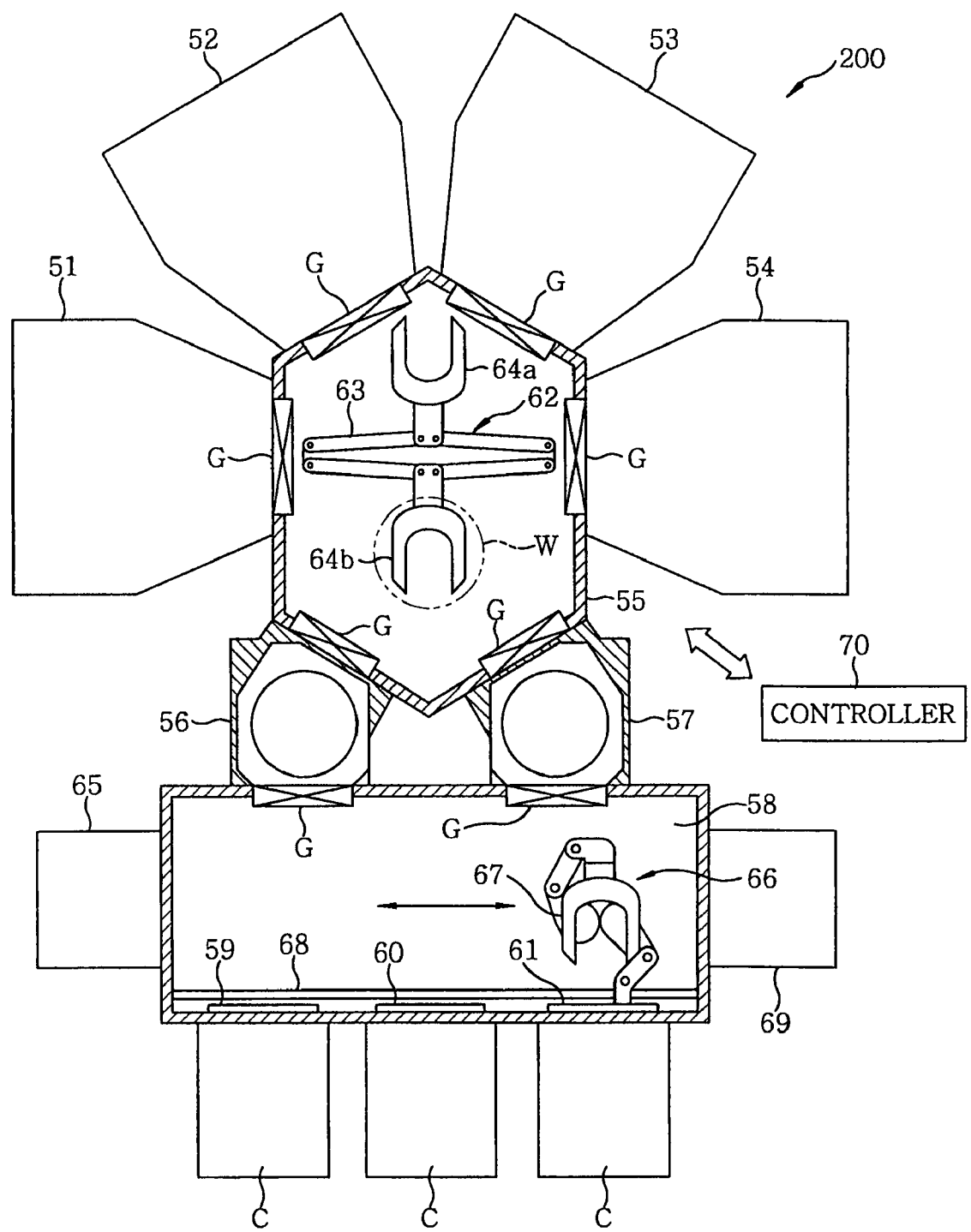
FIG. 10 is a top view showing a schematic configuration of a substrate processing system which includes a silylation processing system for realizing the present invention and can perform etching, ashing and silylation successively.

FIG. 10 is a top view showing a schematic structure of the substrate processing system. This substrate processing system 200 processes a semiconductor wafer (substrate) W in which a photoresist serving as an etching mask having a predetermined circuit pattern is formed on a low-k film serving as an etching target film by a photolithography process. Further, the substrate processing system 200 includes etching units 51 and 52 for performing plasma etching, an ashing unit 53 for performing ashing, and a silylation processing unit 54. These units 51 to 54 are respectively disposed corresponding to four sides of a hexagonal wafer transfer chamber 55. The other two sides of the wafer transfer chamber 55 are respectively connected to load-lock chambers 56 and 57.

A wafer loading/unloading chamber 58 is connected to the load-lock chambers 56 and 57 on their sides opposite to the wafer transfer chamber 55. The wafer loading/unloading chamber 58 has three ports 59, 60, and 61 on its side opposite to the load-lock chambers 56 and 57, wherein three carriers C capable of containing wafers W are mounted on the three ports, respectively. Further, the silylation processing unit 54 has the same main parts as those of the silylation processing apparatus 1 of FIG. 2.

The etching units 51 and 52, the ashing unit 53, the silylation processing unit 54, and the load-lock chambers 56 and 57 are connected to the sides of the wafer transfer chamber 55 respectively through gate valves G, as shown in FIG. 10. Each of the units 51 to 54 and the chambers 56 and 57 communicates with the wafer transfer chamber 55 by opening the corresponding gate valve G, and is blocked from the wafer transfer chamber 55 by closing the corresponding gate valve G. Gate valves G are also disposed between the load-lock chambers 56 and 57 and the wafer loading/unloading chamber 58. Each of the load-lock chambers 56 and 57 communicates with the wafer loading/unloading chamber 58 by opening the corresponding gate valve G, and is blocked from the wafer loading/unloading chamber 58 by closing the corresponding gate valve G.

The wafer transfer chamber 55 is provided with a wafer transfer unit 62 disposed therein, for transferring wafers W to and from the etching units 51 and 52, the ashing unit 53, the silylation processing unit 54, and the load-lock chambers 56 and 57. The wafer transfer unit 62 is disposed substantially at the center of the wafer transfer chamber 55. The wafer transfer unit 62 includes two rotating and extending/retracting portions 63 which are rotatable, extensible and contractible. Two blades 64a and 64b, each blade for supporting a wafer W, are respectively connected to the leading ends of the rotating and extending/retracting portions 63. The two blades 64a and 64b are connected to the rotating and extending/retracting portions 63 to be arranged in opposite directions. Further, the inside of the wafer transfer chamber 55 can be maintained at a predetermined vacuum level.

A carrier C containing wafers W or an empty carrier C may be mounted directly on each of the three ports 59, 60 and 61 of the wafer loading/unloading chamber 58. When the carrier C is mounted, a shutter (not shown) is separated such that the carrier C communicates with the wafer loading/unloading chamber 58 while preventing inflow of outside air. Further, an alignment chamber 65 for performing alignment of a wafer W is disposed on one side of the wafer loading/unloading chamber 58. In addition, a film thickness measurement device 69 is installed at the side of the wafer loading/unloading chamber 58 opposite to the alignment chamber 65. The film thickness measurement device 69 has the same configuration as that of the film thickness measurement device 2 of FIG. 1.

The wafer loading/unloading chamber 58 is provided with a wafer transfer unit 66 disposed therein, for transferring wafers W to and from the carriers C and load-lock chambers 56 and 57. The wafer transfer unit 66 has a multi-joint arm structure and can move on a rail 68 in a direction in which the carriers C are arranged, to transfer a wafer W placed on a hand 67 at its leading end.

Each of the components of the substrate processing system 200 is controlled by a control unit 70. The control unit 70 has the same configuration as that of the control unit 5 of FIG. 1.

In this substrate processing system, when an actual wafer is processed, the wafer W unloaded from the carrier C is transferred to the wafer transfer chamber 55 maintained at a vacuum state via the load-lock chamber 56 or 57. Next, the etching process, the ashing process and the silylation process are carried out successively in the etching unit 51 or 52, the ashing unit 53 and the silylation processing unit 54, respectively, without breaking a vacuum. Before the actual wafer is processed, a carrier C accommodating therein a test wafer having a photoresist film containing OH groups is installed at one of the ports 59, 60 and 61. Then, the test wafer is transferred to the film thickness measurement device 69 so that a film thickness thereof is measured. Thereafter, the test wafer is loaded into the silylation processing unit 54 by the wafer transfer unit 62 of the wafer transfer chamber 55 via the load-lock chamber 56 or 57, and the silylation process is performed. Next, the test wafer that has been subjected to the silylation process is transferred to the load-lock chamber 56 or 57 by the wafer transfer unit 62. The test wafer is unloaded by the wafer transfer unit 66 and then is loaded into the film thickness measurement device 69 to measure a film thickness after the silylation process. Thereafter, the test wafer is returned to the carrier C. This process is performed on a single test wafer or various test wafers, and a film thickness increase amount (film thickness difference) Δt after the silylation process is calculated. In this manner, the processing conditions of the silylation processing unit 54 are inspected.

The present invention can be variously modified without being limited to the above embodiment. For example, in the above embodiment, the present invention is applied to a damage recovery process for a low-k film. However, it is not limited thereto, and may be applied to any film having OH groups generated by damages. Further, in the above embodiment, the present invention is applied to a process for recovering damages from etching and ashing. However, the present invention may be applied to a process for recovering damages from etching or ashing, and may be applied to another process such as a wet cleaning process or the like as long as it is a process for recovering a film having OH groups generated by damages. Moreover, a G-line resist film and a KrF resist film are used as an example of the photoresist film containing OH groups in the above embodiment. However, it is not limited to the photoresist film, and may be a resin film containing OH groups.

Moreover, a silylation process is described as an example of a damage recovery process in the above embodiment. However, it is not limited thereto, and may be another process as long as a reaction for replacing OH groups with $CH_3$ groups and the like can take place.

Further, in the above embodiment, the semiconductor wafer is used as a substrate to be processed. However, the substrate to be processed may be another substrate such as a substrate for use in an FPD (flat panel display) or the like.

While the invention has been shown and described with respect to the embodiments, it will be understood by those skilled in the art that various changes and modification may be made without departing from the scope of the invention as defined in the following claims.

What is claimed is:

1. A processing condition inspection method of a damage recovery process for reforming a film containing OH group generated by damages from an etching or an ashing process, comprising:
   preparing a substrate having a resist film containing an OH group;
   measuring an initial film thickness of the resist film;
   performing a damage recovery process on the resist film by using a processing gas containing a silylation agent after measuring the initial film thickness, wherein a film thickness of the resist film is increased after performing the damage recovery process;
   measuring a film thickness of the resist film after the damage recovery process;
   calculating a film thickness difference of the resist film before and after the damage recovery process; and determining, based on the film thickness difference, whether a processing condition of the damage recovery process performed by using the processing gas containing the silylation agent is appropriate or inappropriate for reforming the film containing OH group generated by damages from the etching or ashing process, wherein said determining includes determining whether an amount of increased film thickness of the resist film after the damage recovery process is within a tolerance range.

2. The processing condition inspection method of claim 1, wherein the film having OH group generated by the damages is a low-k interlayer dielectric film.

3. The processing condition inspection method of claim 1, wherein the resist film is a KrF resist film.

4. The processing condition inspection method of claim 1, wherein the film thickness of the resist film after the damage recovery process is larger than the initial film thickness due to reaction of the processing gas.

5. A processing condition optimization method of a damage recovery process for reforming a film containing OH group generated by damages from an etching or an ashing process, comprising:

preparing a substrate having a resist film containing OH group;

measuring an initial film thickness of the resist film;

performing a damage recovery process on the resist film by using a processing gas containing a silylation agent after measuring the initial film thickness, wherein a film thickness of the resist film is increased after performing the damage recovery process;

measuring a film thickness of the resist after the damage recovery process;

calculating a film thickness difference of the resist before and after the damage recovery process; and adjusting a processing condition of the damage recovery process performed by using the processing gas containing the silylation agent such that the film thickness difference of the resist film before and after the damage recovery process has a value corresponding to an optimal processing condition based on previously obtained data for a relationship between the thickness difference and the processing condition of damage recovery process performed by using the processing gas containing the silylation agent, wherein said adjusting includes adjusting the processing condition such that an amount of increased film thickness of the resist film after the damage recovery process is within a tolerance range.

6. The processing condition optimization method of claim 5, wherein the film having OH group generated by the damages is a low-k interlayer dielectric film.

7. The processing condition optimization method of claim 5, wherein the resist film is a KrF resist film.

8. The processing condition optimization method of claim 5, wherein the film thickness of the resist film after the damage recovery process is larger than the initial film thickness due to reaction of the processing gas.

9. The processing condition optimization method of claim 5, wherein the damage recovery process performed on the resist film carried out at a temperature of 120 to 350° C.

10. The processing condition optimization method of claim 5, wherein the damage recovery process performed on the resist film carried out at a pressure of 1 to 50 Torr (133 to 6666 Pa).

11. A non-transitory computer-readable storage medium storing a program for controlling a damage recovering system including a damage recovering apparatus for reforming a film having OH groups generated by damages from an etching or an ashing process and a film thickness measurement device for measuring a film thickness of a predetermined film, wherein the program, when executed, controls the damage recovering system to perform a processing condition inspection method of a damage recovery process, the method including:

preparing a substrate having a resist film containing an OH group;

measuring an initial film thickness of the resist film;

performing a damage recovery process on the resist film by using a processing gas containing a silylation agent after measuring the initial film thickness, wherein a film thickness of the resist film is increased after performing the damage recovery process;

measuring a film thickness of the resist film after the damage recovery process;

calculating a film thickness difference of the resist film before and after the damage recovery process; and determining, based on the film thickness difference, whether a processing condition of the damage recovery process performed by using the processing gas containing the silylation agent is appropriate or inappropriate for reforming the film containing OH group generated by damages from the etching or ashing process, wherein said determining includes determining whether an amount of increased film thickness of the resist film after the damage recovery process is within a tolerance range.

12. A non-transitory computer-readable storage medium storing a program for controlling a damage recovering system including a damage recovering apparatus for reforming a film having OH groups generated by damages from an etching or an ashing process and a film thickness measurement device for measuring a film thickness of a predetermined film, wherein the program, when executed, controls the damage recovering system to perform a processing condition inspection method of a damage recovery process, the method including:

preparing a substrate having a resist film containing OH group;

measuring an initial film thickness of the resist film;

performing a damage recovery process on the resist film by using a processing gas containing a silylation agent after measuring the initial film thickness, wherein a film thickness of the resist film is increased after performing the damage recovery process;

measuring a film thickness of the resist after the damage recovery process;

calculating a film thickness difference of the resist before and after the damage recovery process; and adjusting a processing condition of the damage recovery process performed by using the processing gas containing the silylation agent such that the film thickness difference of the resist film before and after the damage recovery process has a value corresponding to an optimal processing condition based on previously obtained data for a relationship between the thickness difference and the processing condition of damage recovery process performed by using the processing gas containing the silylation agent, wherein said adjusting includes adjusting the processing condition such that an amount of increased film thickness of the resist film after the damage recovery process is within a tolerance range.

13. A silylation method of a damage recovery process for reforming a film having OH group generated by damages from an etching or an ashing process, comprising:

(a) determining a silylation process optimization condition using a processing gas containing a silylation agent, said determining the silylation process optimization condition including:
- (a-1) preparing a substrate having a resist film containing OH group;
- (a-2) measuring an initial film thickness of the resist film;
- (a-3) performing a damage recovery process on the resist film by using a processing gas containing a silylation agent after measuring the initial film thickness, wherein a film thickness of the resist film is increased after performing the damage recovery process;
- (a-4) measuring a film thickness of the resist after the damage recovery process;
- (a-5) calculating a film thickness difference of the resist before and after the damage recovery process; and
- (a-6) adjusting a processing condition of the damage recovery process performed by using the processing gas containing the silylation agent such that the film thickness difference of the resist film before and after the damage recovery process has a value corresponding to an optimal processing condition based on previously obtained data for a relationship between the thickness difference and the processing condition of damage recovery process performed by using the processing gas containing the silylation agent, (b) transferring a substrate having a low-k interlayer dielectric film having OH group generated by damages from an etching or an ashing process into a processing vessel, (c) setting the processing vessel to the silyation process optimization condition, and (d) performing a silylation processing on the low-k dielectric film, wherein said adjusting includes adjusting the processing condition such that an amount of increased film thickness of the resist film after the damage recovery process is within a tolerance range.

14. The silylation method of claim 13, wherein the resist film is a KrF resist film.

15. The silylation of claim 13, wherein the film thickness of the resist film after the damage recovery process is larger than the initial film thickness due to reaction of the processing gas.

16. The silylation method of claim 13, wherein the silylation process is performed at a temperature of 120 to 350° C.

17. The silylation method of claim 13, wherein the silylation process is performed at a processing gas pressure of 1 to 50 Torr (133 to 6666 Pa).

18. A damage recovery method of reforming a low-k interlayer dielectric film having OH group, comprising:
- (a) performing an etching or an ashing process on a low-k interlayer dielectric film, wherein the etched or ashed dielectric film has OH group due to damages generated by the etching or ashing process,
- (b) determining silylation process optimization conditions using a processing gas containing a silylation agent, the determining silylation process optimization conditions including:
  - (b-1) preparing a substrate having a resist film containing OH group;
  - (b-2) measuring an initial film thickness of the resist film;
  - (b-3) performing a damage recovery process on the resist film by using a processing gas containing a silylation agent after measuring the initial film thickness, wherein a film thickness of the resist film is increased after performing the damage recovery process;
  - (b-4) measuring a film thickness of the resist after the damage recovery process,
  - (b-5) calculating a film thickness difference of the resist before and after the damage recovery process, and
  - (b-6) adjusting a processing condition of the damage recovery process performed by using the processing gas containing the silylation agent such that the film thickness difference of the resist film before and after the damage recovery process has a value corresponding to an optimal processing condition based on previously obtained data for a relationship between the thickness difference and the processing condition of damage recovery process performed by using the processing gas containing the silylation agent,
- (c) transferring a substrate having a low-k interlayer dielectric film having OH group generated by damages from an etching or an ashing process into a processing vessel,
- (d) setting the processing vessel to the silyation process optimization condition, and
- (e) performing a silylation processing on the low-k dielectric film, wherein said adjusting includes adjusting the processing condition such that an amount of increased film thickness of the resist film after the damage recovery process is within a tolerance range.

19. The silylation method of claim 18, wherein the resist film is a KrF resist film.

20. The silyation of claim 18, wherein the film thickness of the resist film after the damage recovery process is larger than the initial film thickness due to reaction of the processing gas.

21. The silylation method of claim 18, wherein the silylation process is performed at a temperature of 120 to 350° C.

22. The silylation method of claim 18, wherein the silylation process is performed at a processing gas pressure of 1 to 50 Torr (133 to 6666 Pa).

* * * * *